United States Patent [19]

Pace

[11] 4,413,238
[45] Nov. 1, 1983

[54] PRECISION DIFFERENTIAL RELAXATION OSCILLATOR CIRCUIT

[75] Inventor: W. David Pace, Tempe, Ariz.

[73] Assignee: Motorola, Inc., Schaumburg, Ill.

[21] Appl. No.: 298,127

[22] Filed: Aug. 31, 1981

[51] Int. Cl.$^3$ .............................................. H03K 4/50
[52] U.S. Cl. ................................. 331/111; 331/108 D
[58] Field of Search ..................... 331/111, 108 D, 143

[56] References Cited

U.S. PATENT DOCUMENTS

| | | | |
|---|---|---|---|
| 3,742,384 | 6/1973 | Breitzmann et al. | 331/108 D X |
| 3,831,113 | 8/1974 | Ahmed | 331/111 |
| 3,904,988 | 9/1975 | Hsiao | 331/111 |
| 4,205,279 | 5/1980 | Beutler | 331/108 D X |

*Primary Examiner*—Siegfried H. Grimm
*Assistant Examiner*—E. Westin
*Attorney, Agent, or Firm*—Michael D. Bingham

[57] ABSTRACT

A relaxation oscillator which is suited for fabrication as a monolithic circuit and which uses a parallel resistive capacitive frequency determining network wherein a capacitor is charged and discharged between an upper and lower voltage level. As the capacitor is charged to a potential exceeding a first threshold voltage level supplied to a comparator switch, the operating state of the comparator is caused to switch. A current detecting circuit is included which is rendered responsive to a current supplied thereto from a charge circuit when the capacitor is charged substantially to the upper voltage level. The current detecting circuit thereafter actuates a control circuit for switching the threshold voltage applied to the comparator from the first level to a second lower level. The actuated control also disables the charge circuit such that the capacitor discharges to the lower voltage level at which time the comparator switches states to disable the control circuit whereby the threshold voltage level is switched to the first level. Thereafter, the charge circuit is enabled to enable the current detecting circuit and to charge the capacitor to the upper voltage level.

10 Claims, 3 Drawing Figures

PRECISION DIFFERENTIAL RELAXATION OSCILLATOR CIRCUIT

BACKGROUND OF THE INVENTION

1. Field of the Invention

This invention relates to relaxation type oscillators incorporating resistive and capacitive elements (RC) and, more particularly, to a RC relaxation type oscillator circuit suitable to be fabricated in integrated circuit form to which a resistive and capacitive frequency determining network is coupled thereto at a single external pin of the oscillator, and wherein the frequency of oscillation is made substantially independent to process and temperature variations in the integrated oscillator circuit.

2. Description of the Prior Art

Relaxation oscillators which generally rely on resistive-capacitive frequency determining networks are utilized in many applications including timing circuits in data transmission systems, sweep oscillators, television receivers, reference oscillators in decoders for stereo FM radio receivers, telephone ringers and telecommunication systems, and the like. Moreover, differential relaxation oscillators that are suited to be fabricated in integrated circuit form are known in the art. For example, U.S. Pat. Nos. 3,688,220 and 3,824,494 disclose such oscillators wherein a sawtooth oscillation signal is generated having a frequency of oscillation determined by the RC frequency determining network.

As disclosed in the prior art relaxation oscillators are found in many different forms but generally are quite sensitive to supply voltage variations, temperature variations and the charge rate at which the capacitive element is charged and discharged which determines the oscillator frequency period. In one favored form the prior art relaxation oscillators comprise a differential comparator amplifier which has a reference voltage applied to one input thereof and the frequency determining network coupled to the other input. In general operation of this type of relaxation oscillator the capacitive element of the frequency determining network is charged at some rate until such a time that the voltage developed thereacross exceeds the trip point of the comparator at which time the capacitor is then caused to be discharged through the resistive element of the frequency determining network. One of the main problems that arise in some of the prior art integrated circuit relaxation oscillators including a comparator ampifier is due to the inaccuracy associated with the charging rate of the capacitor, i.e., the percentage of the oscillation time period that is required to charge the capacitor to its peak value. How accurately the capacitor is charged also affects the precision of the oscillation frequency. For instance, if the rate of charge of the capacitor is too slow the inaccuracy of the oscillator circuit is degenerated since the rate of charge then becomes a function of the devices of the integrated circuit, i.e., the rate will depend on the beta amplification factors of the transistors as well as the junction resistances thereof which vary both with temperature and process variations. Hence, the frequency of oscillation will also vary. If the rate of charge of the capacitor is too fast, the response time of the comparator amplifier becomes critical. The desired charge on the capacitor can be exceeded if the differential amplifier cannot switch at the exact moment the voltage across the capacitor exceeds the reference voltage level as aforedescribed. This causes overshoot of the desired peak voltage across the capacitor which affects the operating frequency of the oscillator. Therefore, due to these errors, it has been very difficult, if not impossible, to fabricate precision differential relaxation oscillators in integrated circuit form.

Thus, a need for a precision relaxation oscillator suited for fabricated in integrated circuit form having an accuracy of ±5% of the desired operating frequency using 1% standard external components arises.

SUMMARY OF THE INVENTION

Accordingly, it is an object of the present invention to provide an improved differential relaxation oscillator circuit.

It is another object of this invention to provide an improved differential relaxation oscillator circuit the operating characteristics of which are substantially independent to temperature and process variations.

In accordance with the foregoing and other objects there is provided an oscillator circuit having a parallel RC timing circuit connected between a point of reference potential and one input of a comparator amplifier, the other input of which is coupled to a fixed reference potential to establish a trip point or switching level for the comparator. A current source charges the capacitive element of the RC timing network towards an upper peak voltage level. The comparator amplifier switches to a second operating state from a first operating state as the voltage across the capacitor exceeds the fixed reference potential which switching occurs prior to the capacitive element being charged to its peak voltage level. A current detecting circuit which is operatively coupled with the current source disables a reference potential control circuit while the capacitive element is being charged. As the capacitive element is charged to a peak voltage level a current is sensed by the detecting circuit that enables the control circuit which is coupled between the other input of the comparator amplifier and the point of reference potential thereby reducing the potential at the other input of the comparator amplifier. Simultaneously, the control circuit disables the current source wherein the capacitive element is allowed to be discharged toward the reduced reference potential level supplied at the other input of the comparator amplifier. Thereafter, the comparator amplifier switches to its first operating state thereby disabling the control circuit such that the current source is then enabled to source current to cause charging of the capacitive element.

By switching the operating states of the comparator amplifier well in advance of the capacitive element being charged to its peak voltage value the speed of the comparator amplifier is not critical to the operation of the oscillator since the comparator amplifier does not determine the point at which charging of the capacitor ceases and discharging thereof begins. Rather, the current detecting circuit by enabling the control circuit to cause reduction of the bias potential supplied to the comparator amplifier determines the point at which the capacitive element is allowed to be discharged by disabling the current source via the control circuit. Thus, the capacitive element can be quickly charged which eliminates inaccuracies due to temperature and circuit fabrication process variations. Moreover, overshoot problems which produce inaccuracies in the frequency of oscillation are avoided.

DETAILED DESCRIPTION OF THE PREFERRED EMBODIMENT

Figure 1:
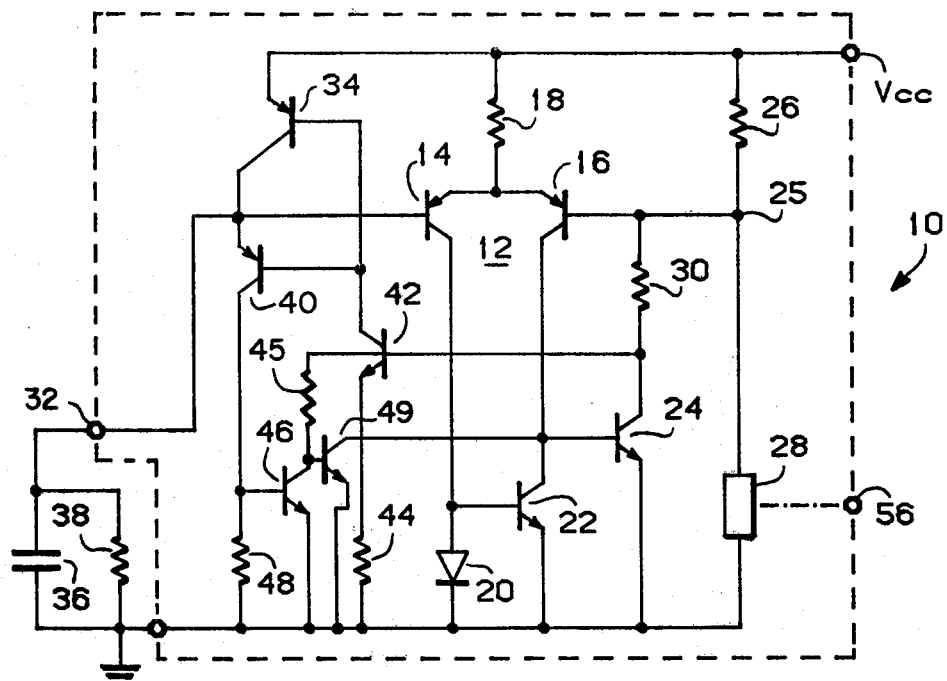
FIG. 1 is a schematic diagram illustrating the oscillator of the preferred embodiment.
Figure 2:
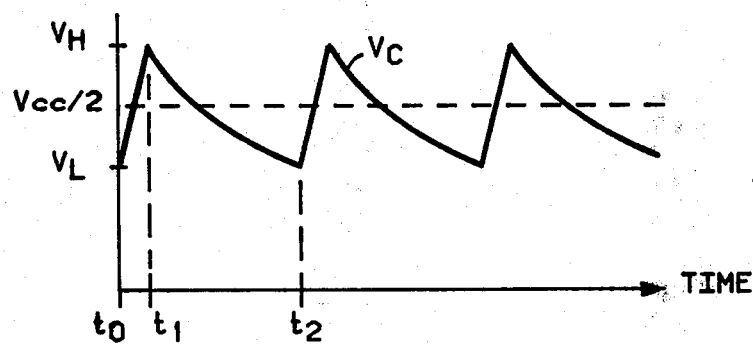
FIG. 2 illustrates waveforms useful in understanding the operation of the oscillator circuit of FIG. 1.

Turning to FIGS. 1 and 2 differential relaxation oscillator 10 of the present invention is now fully described. As indicated by being enclosed within the dashed box, oscillator 10 is suited to be fabricated in integrated form and is coupled between a source of operating potential $V_{CC}$ and ground reference. Oscillator 10 comprises a differential comparator amplifier 12 which includes PNP transistors 14 and 16 differentially coupled at their emitters to $V_{CC}$ via resistor 18. The collectors of transistors 14 and 16 are connected to a differential to single ended converter circuit comprising diode 20 and transistor 22. The differential-to-single ended converter circuit is well understood to those skilled in the art and provides an output from comparator 12 at the base of transistor 24. Diode 20 may be constructed by utilizing a diode connected transistor as is known. The base of transistor 16 serves as one input of comparator 12 which receives a fixed reference potential thereat that appears at the node 25 intersecting series connected resistor 26 and element 28. In one embodiment of the invention element 28 is a resistor having a substantially equal value as resistor 26 which thereby sets the trip point of comparator 12 at $V_{CC}/2$. The output of comparator 12 is returned to the base of transistor 16 through the base to collector path of transistor 24, which has its collector-emitter path coupled between one side of resistor 30 to ground reference. The other side of resistor 30 is returned to the base of transistor 16. The other input of comparator 12 is connected at the base of transistor 14 and is connected to a frequency determining network comprising capacitor 36 and resistor 38 which may be elements external to the integrated circuit. The other side of the frequency determining network is connected to ground reference.

A path for current to charge capacitor 36 is supplied through PNP transistor 34 which has the emitter coupled to $V_{CC}$ and its collector to terminal 32. PNP transistor 40 is provided to sense when transistor 34 becomes saturated and has its emitter coupled to the collector of transistor 34, its base to the base of transistor 34 and its collector to the base of transistor 46. Transistor 42, having its collector-emitter path coupled between the base of transistor 34 and ground reference via resistor 44 renders transistor 34 conductive when transistor 24 is non-conductive such that current is supplied from transistor 34 to charge capacitor 36. Base current drive to transistor 42 is supplied via resistor 30. Transistor 46 which has its base coupled via resistor 48 to ground reference detects in conjunction with transistor 40 being turned on when capacitor 36 is charged to a peak voltage level as will be explained. The collector-emitter path of transistor 46 is connected via inverting transistor 49 to the output of comparator 12, the base of transistor 24 and ground reference. Collector current is supplied via resistor 45.

In operation, as illustrated in FIG. 2, capacitor 36 is charged and then discharged whereby the voltage $V_C$ developed thereacross is generally sawtooth shaped. If it is assumed that at $t_0$ capacitor 36 has been discharged to its lower threshold voltage level $V_L$, comparator 12 will be switched to a first operating state such that transistor 24 is rendered non-conductive since transistor 22 sinks all of the current supplied from the output of the comparator. Hence, a fixed reference potential which may be equal to substantially $V_{CC}/2$ is supplied at the base of transistor 16 at node 25. Thus, the trip point or switching level of comparator 12 is set at an upper threshold level equal to $V_{CC}/2$.

In response to the comparator switching to its first operating state, transistor 42 is rendered conductive to turn on transistor 34 which sources current to charge capacitor 36. As capacitor 36 is charged transistor 34 is in a non-saturated state which reverse biases the emitter-base junction of transistor 40 to keep transistor 40 off. Because transistor 40 is turned off current detecting transistor 46 is also off which allows transistor 49 to be on to sink base current from transistor 24. Therefore, as long as transistor 46 is reverse biased, transistor 24 cannot be rendered conductive.

Prior to $t_1$, when the voltage developed across capacitor 36 exceeds $V_{CC}/2$ as the capacitor is charged, comparator 12 switches operating states whereby transistor 22 is turned off. However, transistor 24 is maintained in a non-conductive state as transistor 49 sinks the current supplied from the output of comparator 12. At $t_1$, capacitor 36 is charged to its upper voltage level $V_H$. As the voltage developed across capacitor 36 approaches $V_H$, transistor 34 becomes saturated which both reduces the magnitude of the current supplied therefrom to the capacitor and forward biases transistor 40. The current supplied from transistor 40 to the base of transistor 46 renders transistor 46 conductive to in turn render transistor 49 non-conductive. In response to transistor 49 becoming non-conductive transistor 24 is no longer disabled and is turned on by the current supplied at the output of comparator 12 to the base thereof.

When transistor 24 is rendered conductive transistor 42 is disabled thereby rendering the current source comprising transistor 42 as well as transistors 34 and 40 non-conductive. Hence, capacitor 36 begins discharging through resistor 38. Concurrently, resistor 30 is placed in parallel with element 28 as transistor 24 becomes conductive to lower the reference potential supplied at the base of transistor 16. Thus, the switching level of comparator 12 is reduced to a value corresponding to $V_L$. This allows capacitor 36 to be discharged to this potential. When the voltage across capacitor 36 decreases to $V_L$, at time $t_2$, comparator 12 switches states causing transistor 24 to become non-conductive. Transistor 42 is then no longer disabled and current is again sourced to capacitor 36 thereby charging the capacitor. Simultaneously, the reference potential supplied at the one input of comparator 12 that appears at node 25 is returned to its higher value, $V_{CC}/2$, and operation of the circuit is repeated. As indicated, an output may be taken at node 56 of the oscillator circuit.

Figure 3:
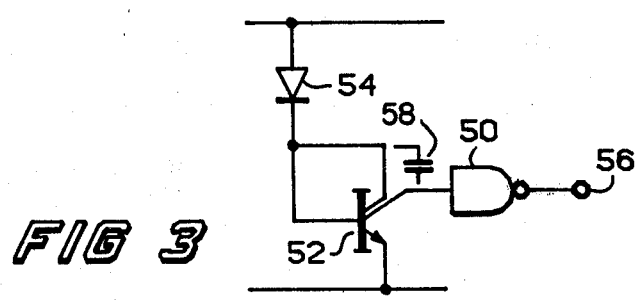
FIG. 3 is a schematic diagram illustrating a bias potential producing output gate circuit that can be utilized in the oscillator of the present invention.

Referring now to FIG. 3, element 28 may be comprised of a NAND gate 50, the input of which is coupled at a collector of multi-collector transistor 52. Multi-collector transistor 52 is connected in series with diode 54 between node 25 and ground reference. Transistor 52 and NAND gate 50 may be formed using known integrated injection logic circuit techniques to provide a buffered output at node 56. For example, setting $V_{CC}$ equal to $4V_{be}$, where $V_{be}$ is the voltage drop across a standard diode, the trip point of comparator 12 is maintained at $V_{CC}/2$. A capacitor 58 may be included to lengthen the duration of the output pulses occurring at outut 56.

A significant aspect of the present invention is that operation of the oscillator circuit is made substantially independent to the switching speed of comparator 12 by setting the upper switching point for instance, midway between the upper and lower peak voltage levels that capacitor 36 is charged and discharged between. Thus, capacitor 36 can be charged at a fast rate to eliminate inaccuracies due to temperature and device process variations while inaccuracies due to slow comparator switching times are eliminated.

Another significant aspect of the present invention relates to detecting a current produced by the capacitor being charged to an upper peak voltage which then causes the capacitor to be discharged. Hence, discharge of the capacitor cannot occur until the comparator has switched from a first operating state to a second operating state "AND" the capacitor charge causes transistor 34 to saturate. Thus, transistor 49 of the detecting circuit and transistor 22 act as a wired AND gate to prevent transistor 24 from disabling the current source until capacitor 36 is charged to its upper peak voltage level.

I claim:

1. Differential relaxation oscillator, comprising:
   frequency determining means including a capacitor which is charged and then discharged between upper and lower voltage levels;
   comparator means having first and second inputs and an output, said first input receiving a threshold voltage, said second input being coupled to said capacitor, said comparator means being switched from a first operating state to a second operating state when the voltage across said capacitor exceeds a first threshold voltage level supplied at said first input;
   charge circuit means for producing charging current when enabled to cause charging of said capacitor;
   control circuit means coupled between said first input and said output of said comparator means and having an output coupled to said charge circuit means which when enabled both causes said threshold voltage to be reduced to a second voltage level and said charge circuit means to be disabled thereby allowing said capacitor to be discharged;
   current detecting means coupled between an output of said charge circuit means and said output of said comparator means which detects a current produced at said output of said charge circuit means when said capacitor is charged to said upper voltage level for enabling said control circuit means such that said capacitor is discharged to said lower voltage level at which said comparator means switches to said first operating state thereby disabling said control circuit means which then enables said charge circuit means.

2. The oscillator of claim 1 wherein said control means includes:
   gate means having an input coupled between said first and second diode means and an output coupled to an output of the oscillator;
   a second resistor coupled between a third terminal at which is supplied a source of operating potential and said first input of said comparator means; and
   a first transistor having first and second main electrodes and a control electrode, said first main electrode being coupled to said second terminal, said second main electrode being coupled to said first input of said comparator means, and said control electrode being coupled to said output of said comparator means.

3. The oscillator of claim 2 wherein said current detecting means includes a second transistor having first and second main electrodes and a control electrode, said first main electrode being coupled to said second terminal, said second main electrode being coupled to said output of said comparator means, said control electrode being coupled to an output of said charge circuit means, and a third resistor coupled between said control electrode of said second transistor and said second terminal.

4. The oscillator of claim 3 wherein said charge circuit means includes:
   a third transistor having first and second main electrodes and a control electrode, said first main electrode being coupled to said second terminal, said control electrode being coupled to said second main electrode of said first transistor;
   a fourth transistor having first, second main electrodes and a control electrode, said first main electrode being coupled to said third terminal, said second main electrode being connected to said first terminal, said control electrode being coupled to said second main electrode of said third transistor; and
   a fifth transistor having first, second main electrodes and a control electrode, said first main electrode being coupled to said second main electrode of said fourth transistor, said second main electrode being coupled to said control electrode of said second transistor, said control electrode being coupled to said control electrode of said fourth transistor.

5. The oscillator of claim 4 wherein said current detecting means includes a sixth transistor having first, second main electrodes and a control electrode, said first main electrode being coupled to said second terminal, said control electrode being coupled to said second main electrode of said second transistor, said second main electrode being coupled to said output of said comparator means, and a fourth resistor connected between said second main electrode of said second transistor and said second main electrode of said first transistor.

6. A monolithic oscillator circuit having a first terminal at which is supplied a source of operating potential, a second terminal at which is supplied a reference potential and an external terminal at which a frequency determining circuit including a capacitor is connected, comprising:
   comparator means having first and second inputs and an output, said first input receiving a threshold voltage, said second input being coupled to the external terminal, said comparator means being switched between a first operating state and a second operating state as the voltage at said second input exceeds a first threshold voltage level supplied at said first input;
   control circuit means operatively coupled between said output and first input of said comparator means which when enabled causes said threshold voltage to switch from said first threshold voltage level to a second threshold voltage level, said control circuit means including a first resistor connected between the first terminal and said first input of said comparator means, first and second diode means serially connected between said first input of said comparator means and the second terminal;

charge circuit means operatively coupled to said control circuit means for supplying charging current to the frequency determining circuit at the external terminal to charge the capacitor when enabled by said control circuit means being disabled, said charge circuit means being disabled by said control circuit means being enabled; and current detecting means operatively coupled between said charge circuit means and said output of said comparator means which is responsive to a current supplied thereto by said charge circuit means when the capacitor is charged to an upper peak value for enabling said control circuit means thereby allowing the capacitor to be discharged to said second threshold voltage level which causes said comparator means to switch to said first operating state and disabling said control circuit means.

7. The oscillator of claim 6 wherein said control circuit means includes:

a first transistor having first and second main electrodes and a control electrode, said control electrode being coupled to said output of the comparator means, said first main electrode being coupled to the second terminal;

a second resistor coupled between said first input of said comparator means and said second main electrode of said first transistor; and gate means having an input and an output, said output being an output of the oscillator, said input being coupled between said first and second serially connected diode means.

8. The oscillator of claim 7 wherein said current detecting means includes a second transistor having first and second main electrodes and a control electrode, said control electrode being coupled to said charge circuit means, said first main electrode being coupled to the second terminal, said second main electrode being coupled to said output of said comparator means, and a third resistor coupled between said control electrode of said second transistor and said second terminal.

9. The oscillator of claim 8 wherein said current detecting means includes circuit means coupling said second main electrode of said second transistor to said second main electrode of said first transistor, and a third transistor having first, second main electrodes and a control electrode, said control electrode being connected to said second main electrode of said second transistor, said first main electrode being coupled to said second terminal and said second main electrode being coupled to said output of said comparator means.

10. The oscillator of claim 9 wherein said charge circuit means includes:

a fourth transistor having first, second main electrodes and a control electrode, said first main electrode being coupled to the second terminal, said control electrode being coupled to said second main electrode of said first transistor;

a fifth transistor having first, second main electrodes and a control electrode, said first main electrode being coupled to the first terminal, said control electrode being coupled to said second main electrode of said fourth transistor, said second main electrode being coupled to the external terminal; and a sixth transistor having first, second main electrodes and a control electrode, said first main electrode being coupled to said second main electrode of said fifth transistor, said control electrode being coupled to said control electrode of said fifth transistor, said second main electrode being coupled to said control electrode of said second transistor.

* * * * *